(12) United States Patent
Kim (10) Patent No.: US 11,929,279 B2
(45) Date of Patent: Mar. 12, 2024

(54) SEMICONDUCTOR DEVICE INCLUDING SEMICONDUCTOR LINER AND METHOD FOR FABRICATING THE SAME

(71) Applicant: SK hynix Inc., Gyeonggi-do (KR)

(72) Inventor: Jin Woong Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 6 days.

(21) Appl. No.: 17/152,390

(22) Filed: Jan. 19, 2021

(65) Prior Publication Data

US 2022/0102193 A1 Mar. 31, 2022

(30) Foreign Application Priority Data

Sep. 25, 2020 (KR) ........................ 10-2020-0124457

(51) Int. Cl.
*H01L 21/02* (2006.01)
*H01L 21/762* (2006.01)
*H10B 12/00* (2023.01)

(52) U.S. Cl.
CPC .... *H01L 21/76224* (2013.01); *H01L 21/0245* (2013.01); *H01L 21/02502* (2013.01); *H01L 21/02661* (2013.01); *H01L 21/02664* (2013.01); *H10B 12/34* (2023.02); *H01L 21/76229* (2013.01)

(58) Field of Classification Search
CPC ........... H01L 21/0245; H01L 21/02436; H01L 21/02439; H01L 21/02441; H01L 21/02494; H01L 21/02496; H01L 21/02502; H01L 21/02505; H01L 21/76; H01L 21/762; H01L 21/76224; H01L 21/76229
See application file for complete search history.

(56) References Cited

U.S. PATENT DOCUMENTS

| 6,136,664 | A | 10/2000 | Economikos et al. |
| 7,994,002 | B2 | 8/2011 | Chang et al. |
| 2010/0059849 | A1* | 3/2010 | Quddus ................. H01L 27/098 438/570 |

(Continued)

FOREIGN PATENT DOCUMENTS

| JP | 2009543355 A | * 12/2009 | ............. C23C 16/54 |
| JP | 2021057439 A | * 4/2021 | ............. C23C 16/02 |

OTHER PUBLICATIONS

Espacenet.com translation from Japanese to English, Takagi et al. (JP 2021057439 A) (Year: 2021).*
Translation of Thakur, JP 2009543355 A, 2009 (Year: 2009).*

*Primary Examiner* — Nicholas J Tobergte
*Assistant Examiner* — William Henry Anderson
(74) *Attorney, Agent, or Firm* — IP & T GROUP LLP (57) ABSTRACT

A semiconductor device including: a trench defining an active region in a substrate; a first semiconductor liner formed over the trench; a second semiconductor liner formed over the first semiconductor liner; and a device isolation layer formed over the second semiconductor liner and filling the trench. Disclosed is also a method for fabricating a semiconductor device, the method including: forming a trench defining an active region in a substrate; forming a plurality of semiconductor liners over the trench; performing pretreatment before forming each of the semiconductor liners; and performing post-treatment after forming each of the semiconductor liners.

20 Claims, 7 Drawing Sheets

(56) References Cited

U.S. PATENT DOCUMENTS

| | | | |
|---|---|---|---|
| 2016/0064212 A1* | 3/2016 | Thedjoisworo | H01J 37/32862 |
| | | | 156/345.26 |
| 2016/0064519 A1* | 3/2016 | Yang | H01L 29/66545 |
| | | | 438/712 |
| 2016/0192502 A1* | 6/2016 | Tolle | H01L 21/02046 |
| | | | 216/13 |
| 2018/0190793 A1* | 7/2018 | Profijt | H01L 21/2256 |
| 2018/0374741 A1* | 12/2018 | Tutuc | H01L 29/7802 |
| 2019/0096997 A1* | 3/2019 | More | H01L 29/7851 |
| 2019/0214391 A1* | 7/2019 | Yoon | H10B 12/34 |

\* cited by examiner

SEMICONDUCTOR DEVICE INCLUDING SEMICONDUCTOR LINER AND METHOD FOR FABRICATING THE SAME

CROSS-REFERENCE TO RELATED APPLICATION(S)

This application claims priority under 35 U.S.C. § 119 to Korean Patent Application No. 10-2020-0124457, filed on Sep. 25, 2020, the disclosure of which is incorporated herein by reference in its entirety.

BACKGROUND

1. Field

Various embodiments of the present disclosure relate to a semiconductor device and a method for fabricating the same, and more particularly, to a semiconductor device including a plurality of pretreated and post-treated semiconductor liners, and a method for fabricating the same.

2. Description of the Related Art

As the integration degree of semiconductor devices increases, the area occupied by the active region of a transistor decreases. Accordingly, the difficulty level of forming the active region increases and the characteristics of the semiconductor device deteriorate. To address this concern, technology of forming a plurality of pretreated and post-treated semiconductor liners has been proposed.

SUMMARY

Various embodiments of the present disclosure are directed to a semiconductor device including a heat-treated trench and semiconductor layer, which may improve the characteristics of the semiconductor device, and a method for fabricating the semiconductor device.

In accordance with an embodiment, a semiconductor device may include: a trench defining an active region in a substrate; a first semiconductor liner formed over the trench; a second semiconductor liner formed over the first semiconductor liner; and a device isolation layer formed over the second semiconductor liner and filling the trench.

In accordance with another embodiment, a method for fabricating a semiconductor device may include: forming a trench defining an active region in a substrate; forming a plurality of semiconductor liners over the trench; performing pretreatment before forming each of the semiconductor liners; and performing post-treatment after forming each of the semiconductor liners.

In accordance with still another embodiment, a method for fabricating a semiconductor device may include: forming a trench defining an active region in a substrate; replacing a native oxide formed on the trench with a solid salt; sublimating the solid salt to expose a surface of the trench; forming a first polysilicon liner over the trench; performing post-treatment to remove a contaminant formed on the first polysilicon liner; replacing a native oxide formed on the first polysilicon liner with a solid salt; sublimating the solid salt to expose a surface of the first polysilicon liner; forming a second polysilicon liner over the first polysilicon liner; and forming a device isolation layer filling the trench over the second polysilicon liner.

DETAILED DESCRIPTION

Embodiments described in the present disclosure will be described with reference to sectional views, plan views and block diagrams that are ideal schematic views of the present disclosure. Accordingly, shapes of the various views may be modified depending on fabrication technology and/or tolerances. Therefore, the embodiments of the present disclosure are not limited to the specific configurations illustrated in the various views, but also include changes in configuration that may be created depending on fabrication processes. That is, regions shown in the drawings have general properties, and shapes of regions shown in the drawings illustrate specific shapes of regions of components and are not intended to limit the scope of the present disclosure. In the drawings, the thicknesses and intervals are expressed for convenience of description and may be exaggerated compared to the actual physical thickness. In the following description, detailed descriptions of known configurations irrelevant to the subject matter of the present disclosure may be omitted. It should be understood that, through the accompanying drawings, like components are designated by like reference numerals if possible, even if the components are indicated in different drawings.

Hereinafter, embodiments of the present disclosure will be described in detail with reference to the drawings. The following description will be made based on a DRAM for simplification of description, but the concept of the present disclosure is not limited thereto, and may be applied to other memories or semiconductor devices.

FIGS. 1 to 11 illustrate a method for fabricating a semiconductor device according to an embodiment of the present disclosure.

Figure 1:
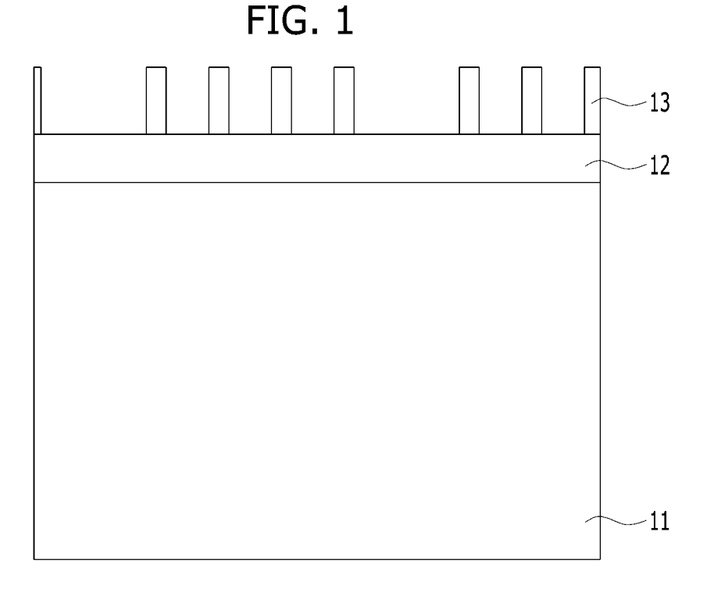
FIGS. 1 to 11 illustrate a method for fabricating a semiconductor device according to an embodiment of the present disclosure.

As shown in FIG. 1, a substrate 11 is prepared. The substrate 11 may include a semiconductor substrate. The substrate 11 may be made of or include a silicon-containing material. The substrate 11 may include silicon, monocrystalline silicon, polysilicon, amorphous silicon, silicon germanium, monocrystalline silicon germanium, polycrystalline silicon germanium, carbon-doped silicon, combinations thereof, or multiple layers thereof. The substrate 11 may include other semiconductor materials such as germanium. The substrate 11 may include a group III-V semiconductor substrate, for example, a compound semiconductor substrate such as GaAs. The substrate 11 may also include a silicon-on-insulator (SOI) substrate.

A trench hard mask 12 may be formed on the substrate 11.

The trench hard mask 12 may include a dielectric material. The trench hard mask 12 may include a material having an etch selectivity with respect to the substrate 11. The trench hard mask 12 may include silicon oxide, silicon nitride, silicon oxynitride, or a combination thereof. In this embodiment, the trench hard mask 12 may include silicon nitride.

A trench pattern 13 may be formed on the trench hard mask 12. The trench pattern 13 may include a photoresist pattern. The trench pattern 13 may define a region in which an active region is to be formed in a subsequent process. Although not shown, the top view of the trench pattern 13 may include a shape in which a pattern inclined in any one direction is repeated in parallel. The top view of the trench pattern 13 may include a shape in which any one of a rectangle, an ellipse, and a rectangle with curved corners, which is inclined in any one direction, is repeated. The trench pattern 13 may define an active region through a subsequent process. The portion remaining without being etched by the trench pattern 13 may include a region in which a transistor is formed by a subsequent process.

Figure 2:
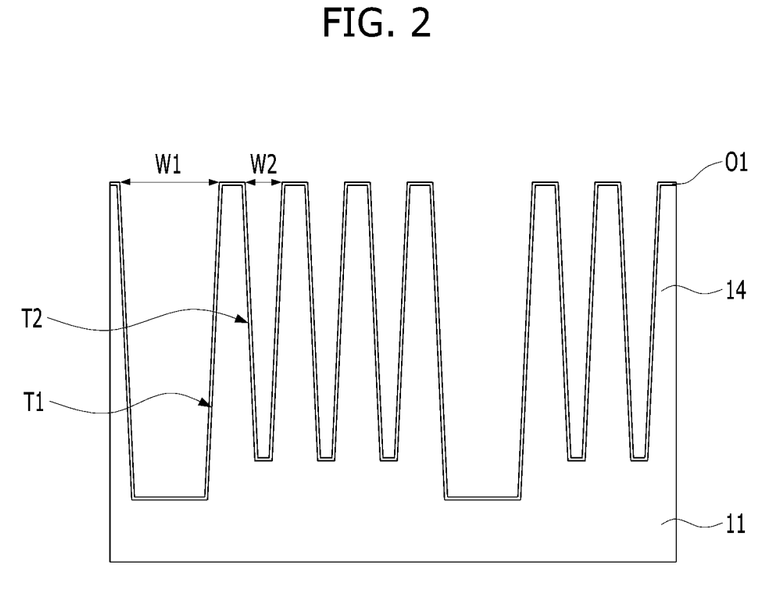

As shown in FIG. 2, the trench hard mask 12 may be etched using the trench pattern 13 as an etching mask. The substrate 11 may be etched using the trench hard mask 12 as an etching mask. After the substrate 11 is etched, the trench pattern 13 and the trench hard mask 12 may be removed. As the substrate 11 is etched, a first trench T1 and a second trench T2 may be formed.

The first trench T1 and the second trench T2 may define an active region 14. The second trench T2 may be formed spaced apart from the first trench T1. The first trench T1 and the second trench T2 may be adjacent to each other. The sidewall profiles of the first trench T1 and the second trench T2 may include a sloped profile. The widths of the first trench T1 and the second trench T2 may decrease gradually from top to bottom. In an embodiment, (not shown), the first trench T1 and the second trench T2 may include a vertical sidewall profile. The first trench T1 may be formed deeper in the substrate 11 than the second trench T2. The depth of the first trench T1 may be greater than the depth of the second trench T2.

The first trench T1 may have a first width W1, and the second trench T2 may have a second width W2. Each of the first width W1 and the second width W2 may be measured in a first direction parallel to the upper surface of the substrate 11. The first direction may be the direction of arrangement of the first and second trenches T1 and T2. The first width W1 may be larger than the second width W2. For example, the first width W1 may be twice the second width W2.

As the first trench T1 and the second trench T2 are formed, a first contaminant O1 may be formed on the surfaces of the substrate 11 and the active region 14. The first contaminant O1 may be formed conformally along the surfaces of the substrate 11 and the active region 14. The first contaminant O1 may include an oxide. The first contaminant O1 may include, a native oxide, e.g., a thin layer of silicon dioxide ($SiO_2$).

Figure 3:
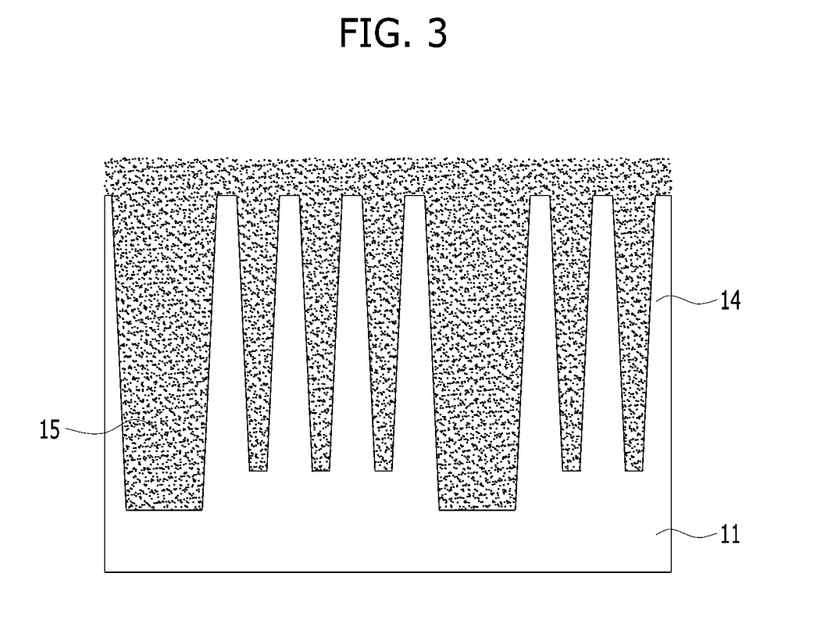
Figure 4:
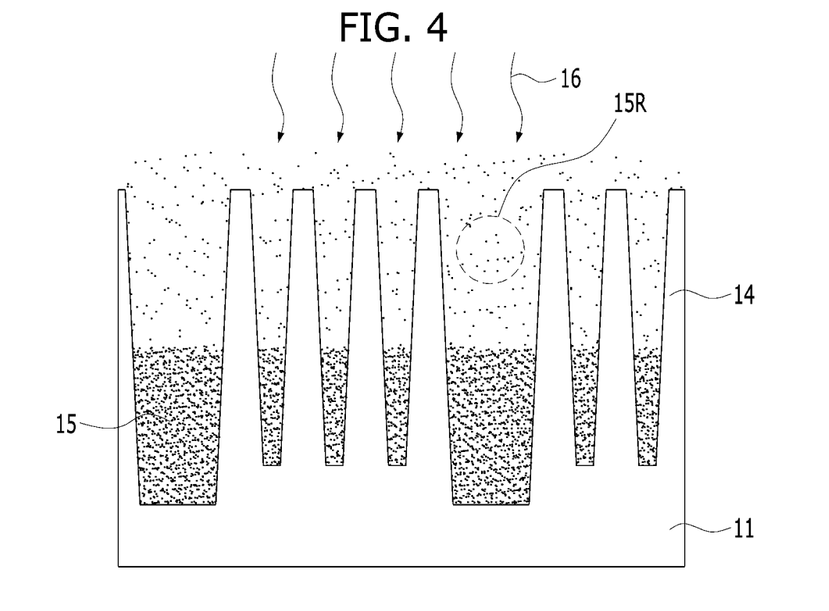

FIGS. 3 and 4 are views for describing a first pretreatment process for removing the first contaminant O1. The first pretreatment process may include replacing the first contaminant O1 with a first sacrificial material 15 (FIG. 3); and removing the first sacrificial material 15 as indicated by reference numeral 15R (FIG. 4).

As shown in FIG. 3, the first contaminant O1 may be replaced with the first sacrificial material 15. The first sacrificial material 15 may cover the substrate 11 and the active region 14. The first sacrificial material 15 may fill the first trench T1 and the second trench T2.

A nitrogen-containing gas, a fluorine-containing gas, a hydrogen-containing gas, or a combination thereof may be used to form the first sacrificial material 15. The first contaminant O1 may be replaced with the first sacrificial material 15 by reaction with a nitrogen-containing gas, a fluorine-containing gas, a hydrogen-containing gas, or a combination thereof. For example, ammonia ($NH_3$), nitrogen trifluoride ($NF_3$) and hydrogen ($H_2$) gases may be used to replace the first contaminant O1 with the first sacrificial material 15. In an embodiment, the amount of each of the gases may be adjusted depending on the thickness of the first contaminant O1 formed on the surfaces of the substrate 11 and the active region 14, the shapes of the substrate 11 and the active region 14, the capacity of an apparatus for forming the first sacrificial material 15, and the like. The ratio between the gases may be changed in order to uniformly remove the first contaminant O1 formed on the substrate 11 and the active region 14. For example, the molar ratio of ammonia ($NH_3$) to nitrogen trifluoride ($NF_3$) may be at least 1:1.

In another embodiment, a purge gas or a carrier gas may further be included. For a stable reaction, the purge gas or the carrier gas may be used before the first sacrificial material 15 is formed. The purge gas or the carrier gas may include helium, hydrogen, nitrogen, or a combination thereof. In this embodiment, hydrogen may be used as the purge gas or the carrier gas.

In order to replace the first contaminant O1 with the first sacrificial material 15, a nitrogen-containing gas, a fluorine-containing gas, a hydrogen-containing gas, or a combination thereof may be decomposed into reactive species. In order to replace the first contaminant O1 with the first sacrificial material 15, ammonia ($NH_3$), nitrogen trifluoride ($NF_3$) and hydrogen ($H_2$) may be decomposed into reactive species. Plasma may be used to decompose each of the gases into reactive species. The decomposed reactive species may be recombined to form a reactive gas. The reactive gas may include ammonium fluoride ($NH_4F$) and ammonium bifluoride ($NH_4F$—HF).

The reactive gas may have reactivity with the first contaminant O1. The reactive gas may react with the first contaminant O1. The reactive gas may react with the first contaminant O1 to form the first sacrificial material 15. The first sacrificial material 15 may be in a solid state. The first sacrificial material 15 may be referred to as a "solid salt". The first sacrificial material 15 may include hydrogen, nitrogen, fluorine, silicon, or a combination thereof. The first sacrificial material 15 may include, for example, ammonium hexafluorosilicate (($NH_4)_2SiF_6$). The reaction mechanism by which the first contaminant O1 is replaced with the first sacrificial material 15 may be summarized as follows:

As shown in FIG. 4, a first heat-treatment process 16 may be performed on the first sacrificial material 15.

Through the first heat-treatment process 16, the first sacrificial material 15 may be removed as volatile gas indicated by reference numeral 15R.

The first sacrificial material 15 may be converted into the volatile gas through the first heat-treatment process 16. The first sacrificial material 15 may be sublimated into $SiF_4$, $NH_3$ and HF and removed as indicated by reference numeral 15R. The first heat-treatment process 16 may be performed at a temperature of from 150° C. or below. In an embodiment, the first heat-treatment process 16 may be performed at a temperature of from 80° C. to 150° C.

As the first sacrificial material 15 is removed as gas indicated by reference numeral 15R, the substrate 11 and the active region 14 may be exposed again. As the first sacrificial material 15 is sublimated into gas as indicated by reference numeral 15R, the surface of the trench may be exposed again.

The reaction mechanism by which the first sacrificial material 15 is sublimated may be summarized as follows:

By performing the first heat-treatment process 16, it is possible to remove the first sacrificial material 15 with which the first contaminant O1 is replaced, while minimizing damage to the substrate 11 and the active region 14. Therefore, it is possible to improve the quality of the semiconductor device.

Figure 5:
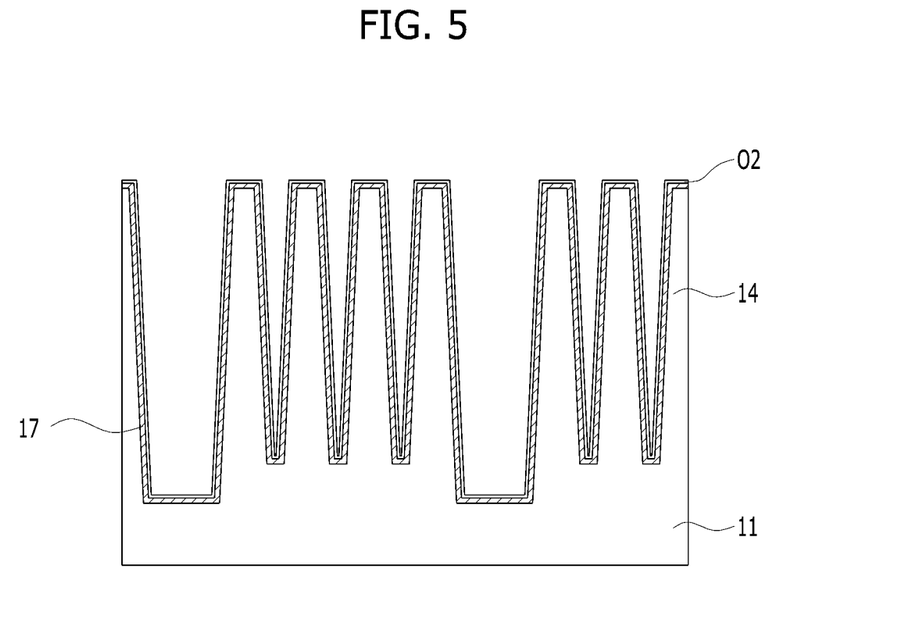

As shown in FIG. 5, a first semiconductor liner 17 may be formed on the substrate 11 and the active region 14. The first semiconductor liner 17 may be formed conformally on the surface of the first and second trenches T1 and T2.

The first semiconductor liner 17 may cover the substrate 11 and the active region 14. The first semiconductor liner 17 may be formed conformally on the surfaces of the substrate 11 and the active region 14. The first semiconductor liner 17 may have a thickness greater than 0 nm and less than or equal to 4 nm.

The first semiconductor liner 17 may grow from the substrate 11 and the active region 14. The first semiconductor liner 17 may be formed from the surfaces of the substrate 11 and the active region 14, for example, by a selective epitaxial growth (SEG) method or a selective poly growth (SPG) method. Accordingly, the first semiconductor liner 17 may include a silicon layer grown from the surfaces of the substrate 11 and the active region 14. The first semiconductor liner 17 may be formed at a temperature of from 400° C. to 900° C. A gas containing silicon, hydrogen, or a combination thereof may be used to form the first semiconductor liner 17. Disilane ($Si_2H_6$) gas may be used to form the first semiconductor liner 17. The first semiconductor liner 17 may be formed of or include poly-silicon (poly-Si). Accordingly, the first semiconductor liner 17 may be referred to as a "first polysilicon liner".

The first semiconductor liner 17 may be formed using a single equipment, a furnace equipment, or a mixture thereof. The first pretreatment process (FIGS. 3 and 4) and the forming of the first semiconductor liner (17 in FIG. 5) may be performed in situ in one system or ex situ in each equipment.

Even if the active region 14 is formed to have a small area, the width of the active region 14 may be increased by forming the first semiconductor liner 17 in a subsequent process, and thus the difficulty level of etching while etching the active region 14 may be lowered.

Subsequently, a second contaminant O2 may be formed on the first semiconductor liner 17. The second contaminant O2 may include a gas remaining in the first semiconductor liner 17. The second contaminant O2 may include particles formed on the first semiconductor liner 17.

Figure 6:
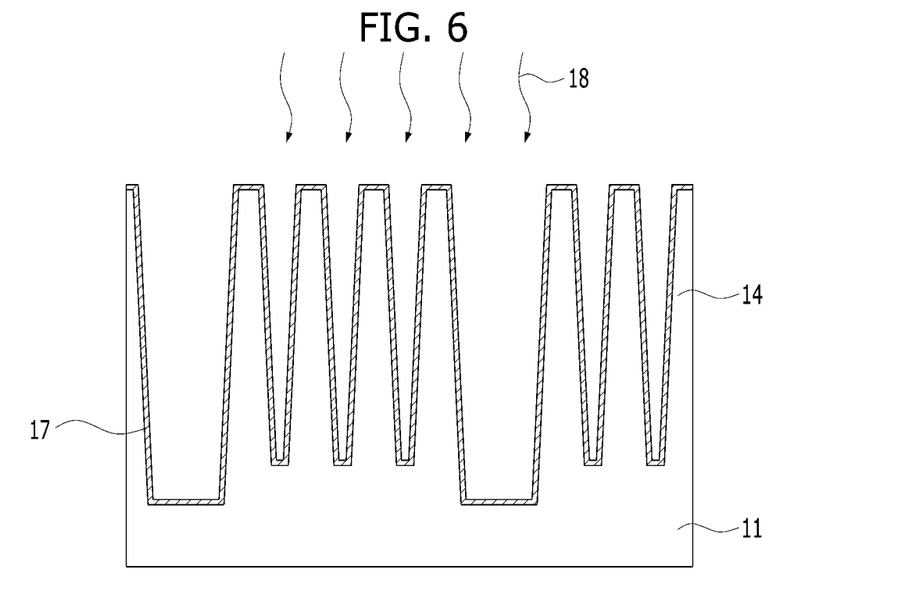

As shown in FIG. 6, a post-treatment process 18 may be performed on the first semiconductor liner 17. The post-treatment process 18 may include a heat-treatment process. The post-treatment process 18 may be performed through an annealing process or a rapid thermal process (RTP). The post-treatment process 18 may be performed at a higher temperature than the first heat treatment process 16. For an annealing process, the post-treatment process 18 may be performed at a temperature of from 500° C. to 900° C.

The post-treatment process 18 may be performed under a gas atmosphere. Nitrogen ($N_2$), hydrogen ($H_2$) or other gases may be used to create the gas atmosphere. By forming the gas atmosphere, the first semiconductor liner 17, the substrate 11, and the active region 14 may be prevented from being oxidized.

Cleaning the first semiconductor liner 17 may further be included, before the post-treatment process 18 is performed. Cleaning the first semiconductor liner 17 may include wet cleaning or dry cleaning. By further cleaning the first semiconductor liner 17, it is possible to additionally remove the second contaminant O2 remaining on the first semiconductor liner 17. Therefore, it is possible to improve the quality of the semiconductor device.

The post-treatment process 18 may be performed in a single equipment, a furnace equipment, or a combination thereof. The post-treatment process 18 may be performed in situ in the same equipment as used for forming the first semiconductor liner 17 (FIG. 5), or may be performed ex situ in another equipment.

By performing the post-treatment process 18, it is possible to remove the second contaminant O2 formed on the first semiconductor liner 17. Accordingly, it is possible to reduce defects in the semiconductor device. In addition, even if a second semiconductor liner is formed on the first semiconductor liner 17 in a subsequent process, a high-quality semiconductor device may be obtained.

Figure 7:
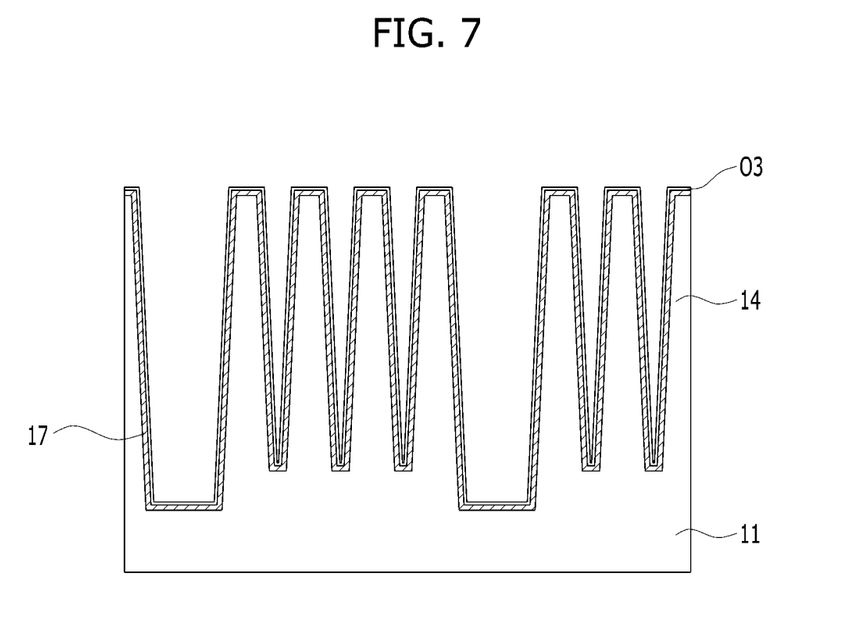

As shown in FIG. 7, a third contaminant O3 may be formed on the first semiconductor liner 17. The third contaminant O3 may be formed without the need to perform a special process. The third contaminant O3 may be formed conformally along the surface of the first semiconductor liner 17. The third contaminant O3 may include an oxide. The third contaminant O3 may include a native oxide. The third contaminant O3 may be or include the same material as that of the first contaminant O1. The third contaminant O3 may be or include silicon dioxide ($SiO_2$).

Figure 8:
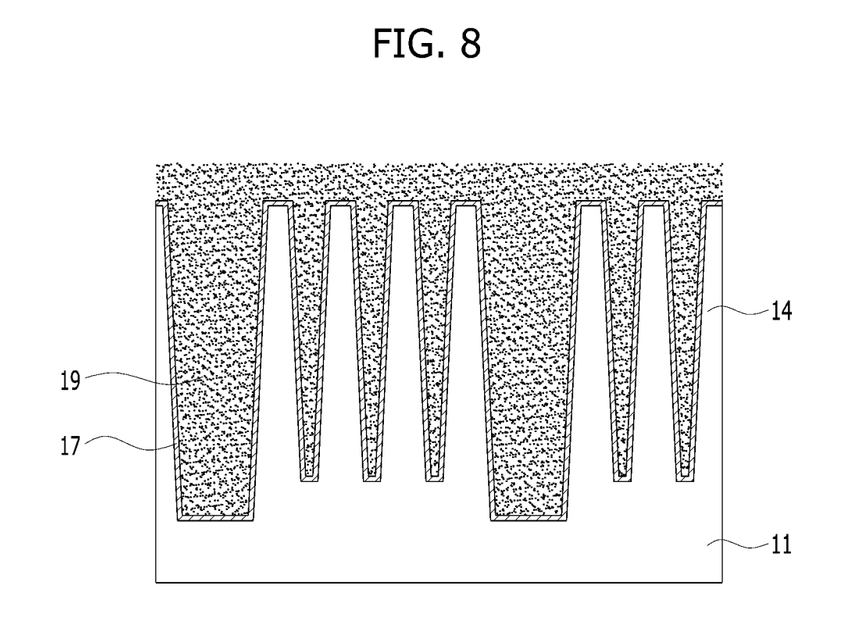
Figure 9:
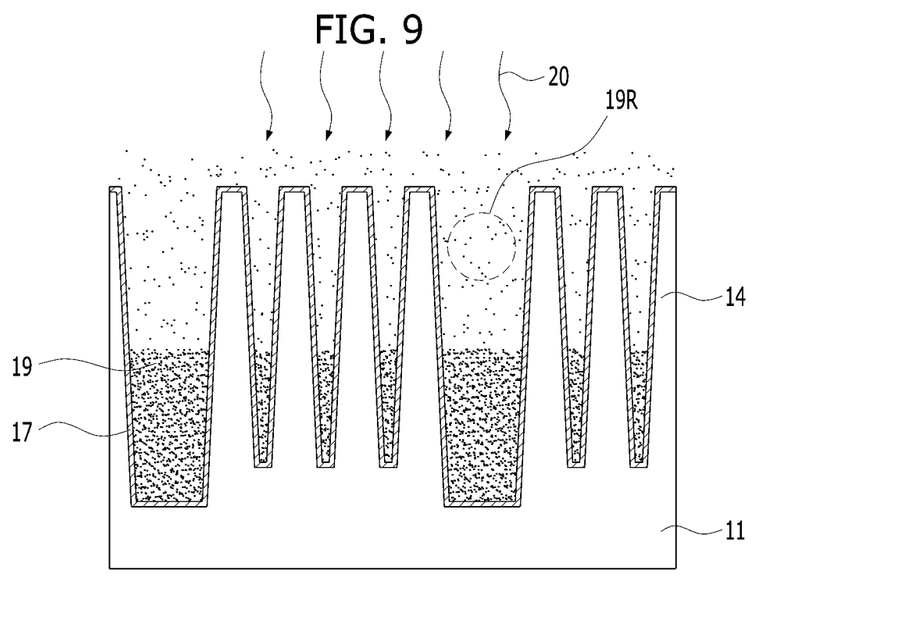

FIGS. 8 and 9 are views for describing a second pretreatment process for removing the third contaminant O3. The second pretreatment process may include replacing the third contaminant O3 with a second sacrificial material 19 (FIG. 8); and removing the second sacrificial material 19 as indicated by reference numeral 19R (FIG. 9). The second pretreatment process may be similar to the first pretreatment process (FIGS. 3 and 4).

As shown in FIG. 8, the third contaminant O3 may be replaced with the second sacrificial material 19. The second sacrificial material 19 may cover the first semiconductor liner 17. The second sacrificial material 19 may be formed on the first semiconductor liner 17. In an embodiment, the second sacrificial material 19 may be formed of or include the same material as the first sacrificial material 15.

In order to form the second sacrificial material 19, a nitrogen-containing gas, a fluorine-containing gas, a hydrogen-containing gas, or a combination thereof may be used. The third contaminant O3 may be replaced with the second sacrificial material 19 by reaction with a nitrogen-containing gas, a fluorine-containing gas, a hydrogen-containing gas, or a combination thereof. For example, ammonia ($NH_3$), nitrogen trifluoride ($NF_3$) and hydrogen ($H_2$) gases may be used to replace the third contaminant O3 with the second sacrificial material 19. In an embodiment, the amount of each of the gases may be adjusted depending on the thickness of the third contaminant O3 formed on the surface of the first semiconductor liner 17, the shape of the first semiconductor liner 17, and the capacity of an apparatus for forming the second sacrificial material 19. The ratio between the gases may be changed in order to uniformly remove the third contaminant O3 formed on the first semiconductor liner 17.

For example, the molar ratio of ammonia (NH$_3$) to nitrogen trifluoride (NF$_3$) may be at least 1:1.

In another embodiment, a purge gas or a carrier gas may further be included. For a stable reaction, the purge gas or the carrier gas may be used before the second sacrificial material 19 is formed. The purge gas or the carrier gas may include helium, hydrogen, nitrogen, or a combination thereof. In this embodiment, hydrogen may be used as the purge gas or the carrier gas.

In order to replace the third contaminant O3 with the second sacrificial material 19, a nitrogen-containing gas, a fluorine-containing gas, a hydrogen-containing gas, or a combination thereof may be decomposed into reactive species. Ammonia (NH$_3$), nitrogen trifluoride (NF$_3$) and hydrogen (H$_2$) may be decomposed into reactive species in order to replace the third contaminant O3 with the second sacrificial material 19. Plasma may be used to decompose each gas into reactive species. The decomposed reactive species may be recombined to form a reactive gas. The reactive gas may include ammonium fluoride (NH$_4$F) and ammonium bifluoride (NH$_4$F—HF).

The reactive gas may have reactivity with the third contaminant O3. The reactive gas may react with the third contaminant O3. The reactive gas may react with the third contaminant O3 to form the second sacrificial material 19. The second sacrificial material 19 may be in a solid state. Accordingly, the second sacrificial material 19 may be referred to as a "solid salt". The second sacrificial material 19 may include hydrogen, nitrogen, fluorine, silicon, or a combination thereof. The second sacrificial material 19 may include ammonium hexafluorosilicate ((NH$_4$)$_2$SiF$_6$).

The reaction mechanism by which the third contaminant O3 is replaced with the second sacrificial material 19 may be summarized as follows:

NF$_3$(gas)+NH$_3$(gas)+3H$_2$→NF$_3$F(gas)+NH$_4$—HF (gas)

NF$_3$F(gas)+NH$_4$—HF(gas)+SiO$_2$→(NH$_4$)$_2$SiF$_6$(Soild, Salt)

As shown in FIG. 9, the second sacrificial material 19 may be removed as indicated by reference numeral 19R through a second heat-treatment process 20. The second sacrificial material 19 may be converted into a volatile gas 19R through the second heat-treatment process 20. The second sacrificial material 19 may be sublimated into SiF$_4$, NH$_3$ and HF and removed as indicated by reference numeral 19R. The second heat-treatment process 20 may include a heat treatment process that is performed at a temperature of from 150° C. or below. In an embodiment, the second heat-treatment process 20 may be performed at a temperature of from 80° C. to 150° C. As the second sacrificial material 19 is removed as indicated by reference numeral 19R, the surface of the first semiconductor liner 17 may be exposed again.

The reaction mechanism by which the second sacrificial material 19 is sublimated may be summarized as follows:

(NH$_4$)$_2$SiF$_6$(Solid,Salt)→SiF$_4$(gas)+2NH$_3$(gas)+2HF (gas)+H$_2$O

By performing the second heat-treatment process 20, it is possible to remove the second sacrificial material 19 with which the third contaminant O3 is replaced, while minimizing damage to the first semiconductor liner 17 and the active region 14. Therefore, it is possible to improve the quality of the semiconducting device.

Figure 10:
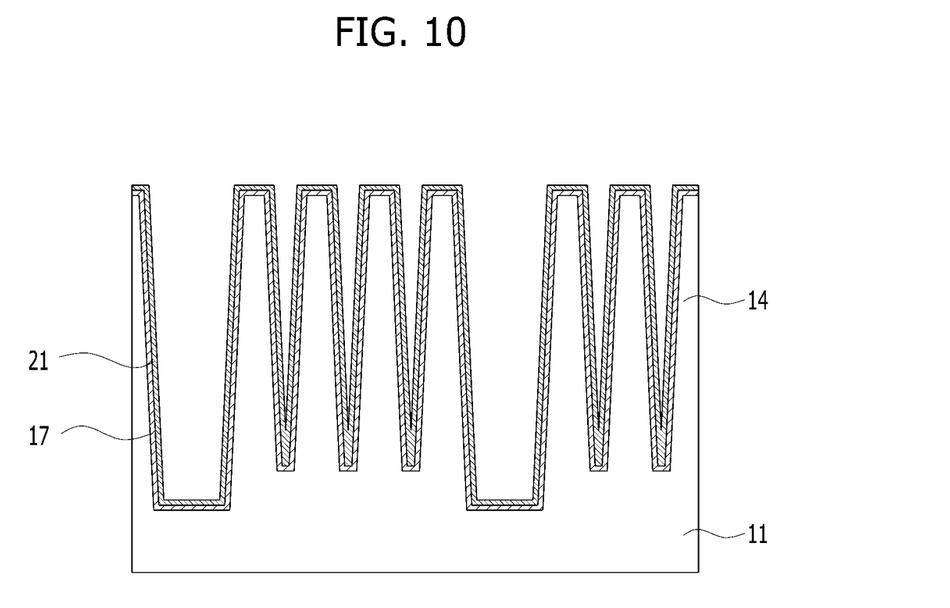

As shown in FIG. 10, a second semiconductor liner 21 may be formed on the first semiconductor liner 17. The second semiconductor liner 21 may cover the first semiconductor liner 17. The second semiconductor liner 21 may be formed conformally on the surface of the first semiconductor liner 17. The second semiconductor liner 21 may have a thickness greater than 0 nm and less than or equal to 4 nm. The second semiconductor liner 21 may have the same thickness as the first semiconductor liner 17.

The second semiconductor liner 21 may be formed from the first semiconductor liner 17 by a selective epitaxial growth (SEG) method or a selective poly growth (SPG) method. Accordingly, the second semiconductor liner 21 may include a silicon layer grown from the surface of the first semiconductor liner 17. The second semiconductor liner 21 may be formed at a temperature of from 400° C. to 900° C. A gas containing silicon, hydrogen, or a combination thereof may be used to form the second semiconductor liner 21. Si$_2$H$_6$ gas may be used to form the second semiconductor liner 21. The second semiconductor liner 21 may be formed of or include poly-silicon (poly-Si). Accordingly, the second semiconductor liner 21 may be referred to as a "second polysilicon liner". The substrate 11, the first semiconductor liner 17 and the second semiconductor liner 21 may be formed of or include a silicon-containing material.

The second semiconductor liner 21 may be formed using a single equipment, a furnace equipment, or a combination thereof. The second pretreatment process (FIGS. 8 and 9) and the forming of the second semiconductor liner (21 in FIG. 10) may be performed in situ in a single equipment or ex situ in each equipment.

Although not shown, a second post-treatment process may be performed on the second semiconductor liner 21 after the second semiconductor liner 21 is formed. The second post-treatment process may be performed in the same manner as the post-treatment process (18 in FIG. 6) performed on the first semiconductor liner 17. By performing the second post-treatment process, it is possible to remove contaminants, such as particles formed on the second semiconductor liner 21 or residual gas. Accordingly, it is possible to reduce defects in the semiconductor device.

Figure 11:
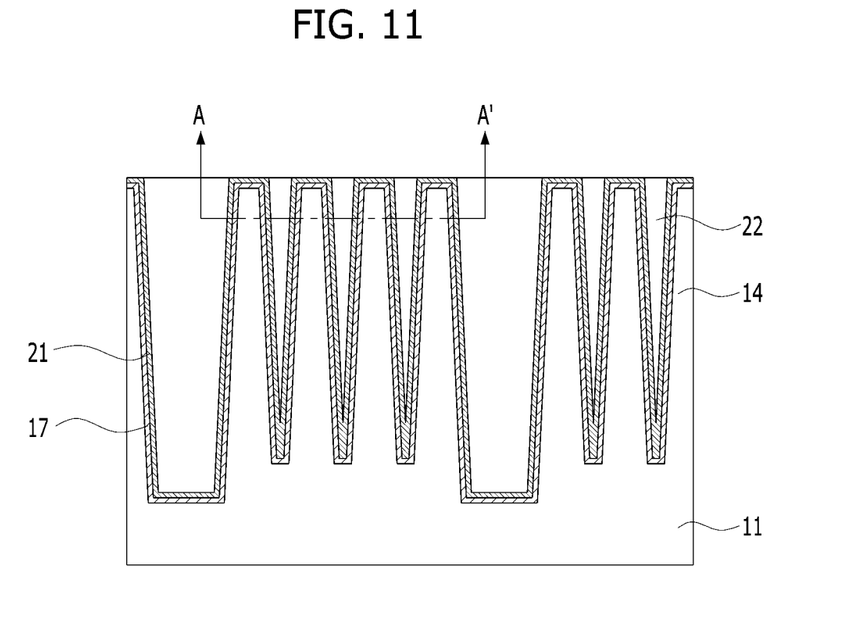

As shown in FIG. 11, a device isolation layer 22 may be formed over the substrate 11.

The device isolation layer 22 may be formed on the second semiconductor liner 21. The device isolation layer 22 may fill the space between the active regions 14. The upper surface of the device isolation layer 22 may be at the same level as the upper surface of the second semiconductor liner 21. A planarization process may be performed to form the device isolation layer 22. The device isolation layer 22 may include, for example, silicon nitride, silicon oxide, or a combination thereof.

Figure 12:
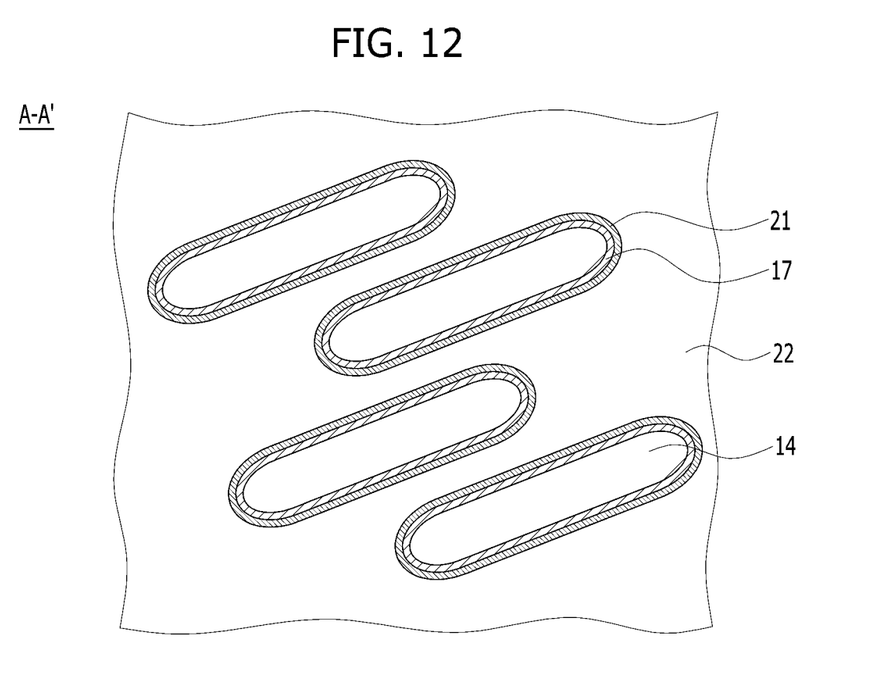
FIG. 12 is a sectional top view of a semiconductor device according to an embodiment of the present disclosure.

FIG. 12 is a sectional top-view taken along line A-A' of FIG. 11.

As shown in FIG. 12, the first semiconductor liner 17 may include a shape surrounding the active region 14. The second semiconductor liner 21 may include a shape surrounding the first semiconductor liner 17. The device isolation layer 22 may fill between the second semiconductor liners 21 surrounding the adjacent active regions 14.

In the present disclosure, even if the active region 14 is formed to have a small area, it is possible to increase the width of the active region 14 by forming the first semiconductor liner 17 and the second semiconductor liner 21 in a subsequent process, and thus the difficulty level of etching while etching the active region 14 may be lowered. Since the first semiconductor liner 17 and the second semiconductor liner 21 are formed after the active region 14 is etched, the width and depth of the active region 14 may be adjusted.

Accordingly, it is possible to improve the characteristics of the semiconductor device.

In addition, after the first semiconductor liner 17 is formed, impurities are removed by performing the post-treatment process 18, and subsequently the second semiconductor liner 21 is formed on the first semiconductor liner 17. Thus, it is possible to grow the active region 14 to a predetermined thickness or more without degrading the quality of the surface of the active region 14. Accordingly, the depth and width of the active region 14 may be secured.

Figure 13:
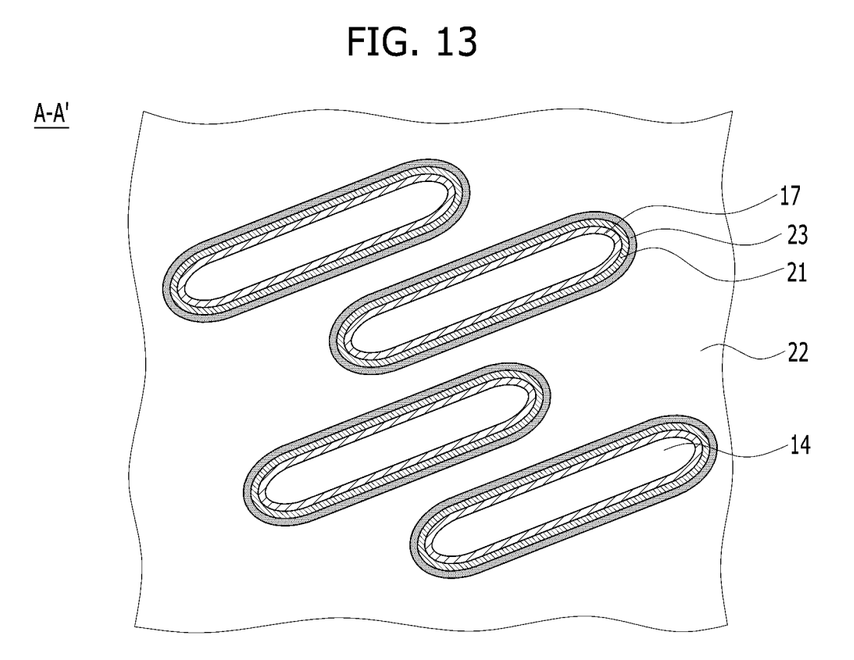
FIG. 13 is a sectional top view of a semiconductor device according to an embodiment of the present disclosure.

FIG. 13 is a sectional top view for another embodiment. Although only the first and second semiconductor liners 17 and 21 have been described in the above-described embodiment, the present disclosure is not limited thereto, and thus a plurality of semiconductor liners may be stacked in other embodiments.

As shown in FIG. 13, a third semiconductor liner 23 surrounding the second semiconductor liner 21 may be formed on the second semiconductor liner 21. The third semiconductor liner 23 may be formed by repeating the method of forming the second semiconductor liner 21. Therefore, performing a second post-treatment process on the second semiconductor liner 21, performing a third pretreatment process on the second semiconductor liner 21, and forming the third semiconductor liner 23 may be sequentially performed.

Specifically, the second post-treatment process (not shown) may be performed on the second semiconductor liner 21. The second post-treatment process (not shown) may be performed in the same manner as the first post-treatment process (18 in FIG. 6). Accordingly, the second post-treatment process (not shown) may be performed through an annealing process or a rapid thermal process (RTP).

Subsequently, the third pretreatment process may be performed to remove the contaminant formed on the second semiconductor liner 21. The third pretreatment process may be performed in the same manner as the second pretreatment process (FIGS. 8 and 9). Therefore, after the contaminant is replaced with a sacrificial material, the sacrificial material may be sublimated and removed by a heat-treatment process. The mechanism by which the contaminant is removed may be summarized as follows:

Subsequently, the third semiconductor liner 23 may be formed on the second semiconductor liner 21. The third semiconductor liner 23 may be formed from the second semiconductor liner 21 by a selective epitaxial growth (SEG) method or a selective poly growth (SPG) method. The third semiconductor liner 23 may include a silicon layer grown from the surface of the second semiconductor liner 21. The third semiconductor liner 23 may include polysilicon (poly-Si).

Although not shown, a plurality of semiconductor liners may be stacked in the same manner.

As described above, according to the present technology, it is possible to remove a contaminant on the substrate by pretreating the semiconductor liner. Accordingly, it is possible to improve the characteristics of the semiconductor device.

According to the present technology, it is possible to remove a contaminant on the semiconductor line and reduce defects in the semiconductor device by post-treating the semiconductor liner.

According to the present technology, it is possible to lower the difficulty level of etching for forming the trench and ensure the width and depth of the active region by stacking a plurality of semiconductor liners.

While the present disclosure has been illustrated and described with respect to specific embodiments, the disclosed embodiments are provided for the description, and not intended to be restrictive. Further, it is noted that the present disclosure may be achieved in various ways through substitution, change, and modification that fall within the scope of the following claims, as those skilled in the art will recognize in light of the present disclosure.

What is claimed is:

1. A method for fabricating a semiconductor device, the method comprising:
   forming a trench defining an active region in a substrate;
   forming a plurality of semiconductor liners over the trench;
   performing a pretreatment before forming each of the semiconductor liners;
   performing a post-treatment after forming each of the semiconductor liners; and
   forming a device isolation layer filling the trench over the plurality of semiconductor liners after performing the post-treatment,
   wherein the plurality of semiconductor liners are formed by stacking polysilicon (poly-Si).

2. The method of claim 1, wherein the performing of the pretreatment comprises:
   replacing a contaminant generated before forming each of the semiconductor liners with a sacrificial material; and
   performing heat treatment to remove the sacrificial material.

3. The method of claim 2, wherein the replacing of the contaminant with the sacrificial material is performed using a reactive gas having reactivity with the contaminant.

4. The method of claim 3, wherein the reactive gas is formed using ammonia ($NH_3$) gas, nitrogen trifluoride ($NF_3$) gas and hydrogen ($H_2$) gas.

5. The method of claim 2, wherein
   the contaminant comprises silicon oxide, and
   the sacrificial material comprises ammonium hexafluorosilicate (($NH_4)_2SiF_6$).

6. The method of claim 1, wherein the post-treatment is performed at a higher temperature than the pretreatment.

7. The method of claim 1, wherein the post-treatment is performed through an annealing process or a rapid thermal process (RTP).

8. The method of claim 1, wherein the post-treatment is performed under a gas atmosphere containing one of nitrogen ($N_2$) and hydrogen ($H_2$).

9. The method of claim 1, further comprising cleaning each of the semiconductor liners, before the performing of the post-treatment.

10. The method of claim 1, wherein the pretreatment and the forming of the semiconductor liners are performed in situ.

11. The method of claim 1, wherein the post-treatment is performed in one of a single equipment and a furnace equipment.

12. A method for fabricating a semiconductor device, the method comprising:
   forming a trench defining an active region in a substrate;

performing a first pretreatment in which a native oxide formed on the trench is replaced with a solid salt and the solid salt is sublimated to expose a surface of the trench;

forming a first polysilicon liner over the trench;

performing a post-treatment to remove a contaminant formed on the first polysilicon liner;

performing a second pretreatment in which a native oxide formed on the first polysilicon liner is replaced with a solid salt and the solid salt is sublimated to expose a surface of the first poly silicon liner;

forming a second polysilicon liner over the first polysilicon liner; and forming a device isolation layer filing the trench over the second polysilicon liner.

13. The method of claim 12, wherein the replacing of the native oxide with the solid salt is performed using a reactive gas having reactivity with the native oxide.

14. The method of claim 13, wherein the reactive gas is formed using ammonia ($NH_3$) gas, nitrogen trifluoride ($NF_3$) gas and hydrogen ($H_2$) gas.

15. The method of claim 12, wherein the solid salt comprises ammonium hexafluorosilicate (($NH_4)_2SiF_6$).

16. The method of claim 12, wherein the post-treatment is performed at a higher temperature than the sublimating of the solid salt.

17. The method of claim 12, wherein the post-treatment is performed through an annealing process or a rapid thermal process (RTP).

18. The method of claim 12, wherein the post-treatment is performed under a gas atmosphere containing one of nitrogen ($N_2$) and hydrogen ($H_2$).

19. The method of claim 12, further comprising cleaning the first polysilicon liner, before the performing of the post-treatment.

20. The method of claim 12, wherein the post-treatment is performed in one of a single equipment and a furnace equipment.

* * * * *